United States Patent [19]
Gill

[11] Patent Number: 5,354,703
[45] Date of Patent: Oct. 11, 1994

[54] EEPROM CELL ARRAY WITH TIGHT ERASE DISTRIBUTION

[75] Inventor: Manzur Gill, Arcola, Tex.

[73] Assignee: Texas Instruments Incorporated, Dallas, Tex.

[21] Appl. No.: 85,430

[22] Filed: Jun. 29, 1993

Related U.S. Application Data

[60] Division of Ser. No. 925,282, Aug. 6, 1992, Pat. No. 5,264,718, which is a continuation of Ser. No. 723,010, Jun. 28, 1991, abandoned.

[51] Int. Cl.$^5$ .................................... H01L 21/70
[52] U.S. Cl. ............................. 437/52; 437/43; 437/48
[58] Field of Search ............... 437/47, 48, 52, 195, 437/228, 235

[56] References Cited

U.S. PATENT DOCUMENTS

| | | | |
|---|---|---|---|
| 4,426,764 | 1/1984 | Kosa et al. | 437/52 |
| 5,019,527 | 5/1991 | Ohshima et al. | 437/43 |

FOREIGN PATENT DOCUMENTS 0152673  6/1989  Japan .

Primary Examiner—Tom Thomas
Attorney, Agent, or Firm—Theodore D. Lindgren; Leo N. Heiting; Richard L. Donaldson

[57] ABSTRACT

An electrically-erasable, electrically-programmable, read-only-memory cell array is formed in pairs at a face of a semiconductor substrate (22). Each memory cell includes a source (11) and a drain (12), with a corresponding channel (Ch) between. A control gate (14) is disposed over the floating gate (13), insulated by an intervening inter-level dielectric (27). The floating gate (13) and the control gate (14) include a channel section (Ch). The channel section (Ch) is used as a self-alignment implant mask for the sources (11) and drains (12), such that the channel-junction edges are aligned with the corresponding edges of the channel section (Ch). Each memory cell is programmed by hot-carrier injection from the channel to the floating gate (13), and erased by Fowler-Nordheim tunneling from the floating gate (13) to the source (11). The program and erase regions of each cell are physically separate from each other, and the characteristics of each of those regions may be made optimum independently from each other. Field oxide insulators (25) defining the channels (Ch) and the source line (17) have straight-line edges adjacent the source line (17) and adjacent the channel (Ch).

6 Claims, 7 Drawing Sheets

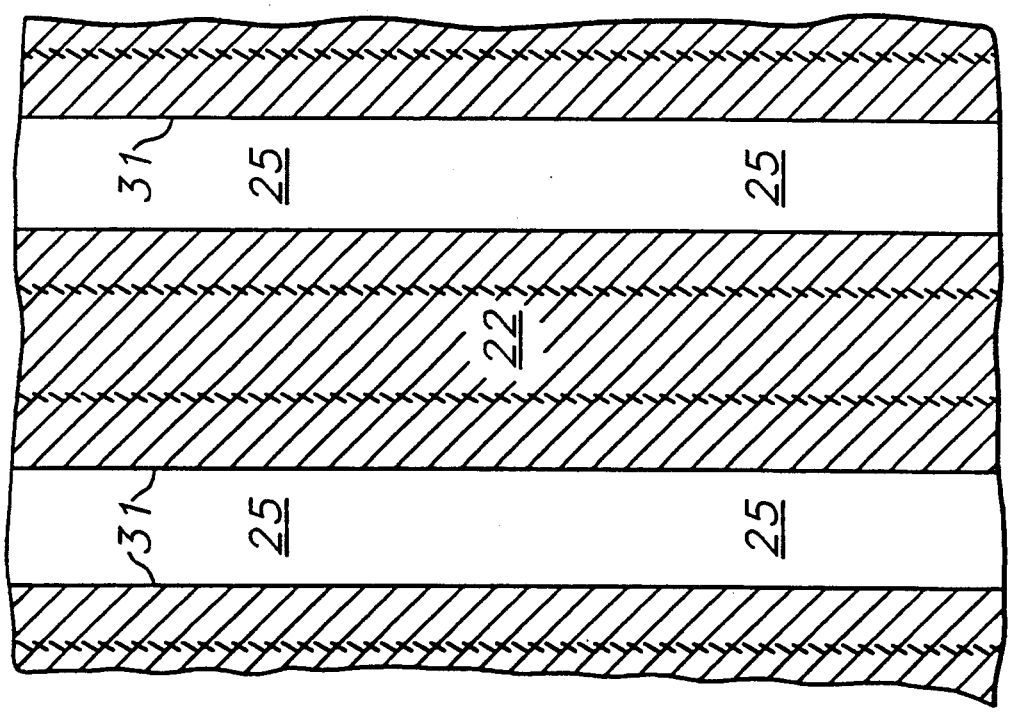
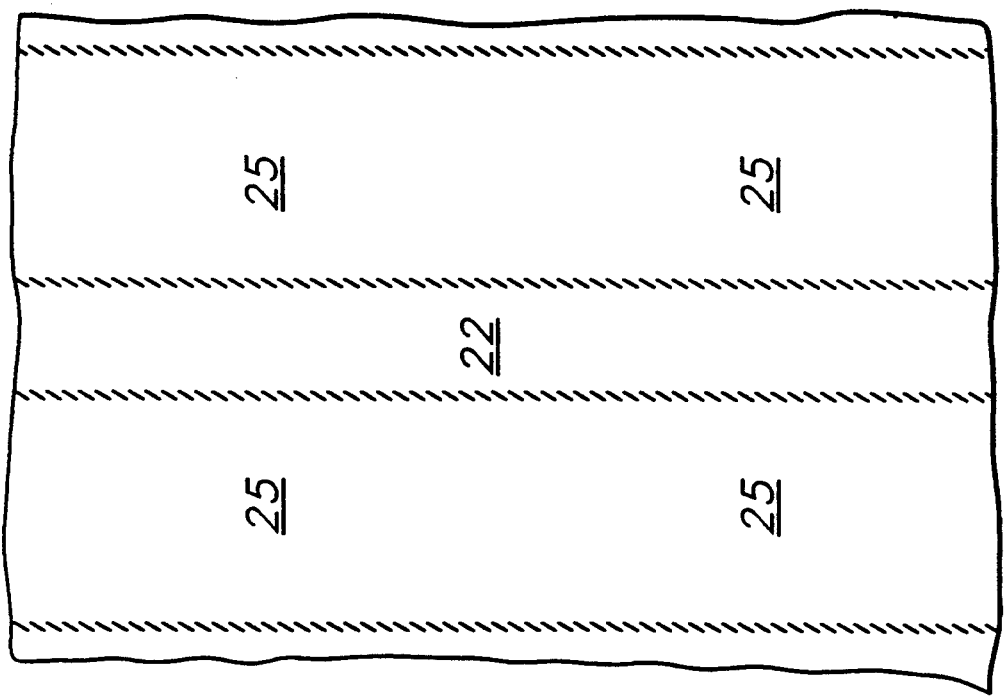

EEPROM CELL ARRAY WITH TIGHT ERASE DISTRIBUTION

This is a division of application Ser. No. 07/925,282, filed Aug. 6, 1992 now U.S. Pat. No. 5,264,718,issued Nov. 23, 1993, which is a continuation of abandoned Application Ser. No. 07/723,010 filed on Jun. 28, 1991.

RELATED APPLICATIONS

This application is related to U.S. Pats. No. 4,994,403, issued Feb. 19, 1991; No. 5,008,721, issued Apr. 16, 1991; No. 5,010,028, issued Apr. 23, 1991; No. 5,012,307, issued Apr. 30, 1991; No. 5,017,980, issued May 21, 1991; and in co-pending U.S. Pat. applications Ser. No. 07/637,390, filed Jan. 4, 1991; Ser. No. 07/ 741,975,filed Aug. 6, 1991, now U.S. Pat. No. 5,168,335 issued Dec. 1, 1992; Ser. No. 07/507,823, filed Apr. 12, 1990; Ser. No. 07/908,610, filed Jun. 29, 1992, now abandoned; Ser. No. 07/908,611, filed Jun. 29, 1992, now abandoned; Ser. No. 07/895,144, filed Jun. 5, 1992, now abandoned; and Ser. No. 07/895,143, filed Jun. 5, 1992, now abandoned; all assigned to Texas Instruments Incorporated, the assignee of this invention. The foregoing patents and patent applications are incorporated herein by reference.

BACKGROUND OF THE INVENTION

The present invention relates to a nonvolatile, integrated-circuit memory such as an electrically-erasable, electrically-programmable read-only-memory (EEPROM), and more particularly to an EEPROM memory cell that is programmed by hot-carrier injection in one region and is erased by Fowler-Nordheim tunneling in another region, and to a method of fabricating such a device.

EEPROMs employing single transistor memory cells, using hot-carrier injection for programing and Fowler-Nordheim tunneling for erasure have been described in: (a) "A Single Transistor EEPROM cell and its implementation in a 512K CMOS EEPROM", S. Mukherjee et al., IEDM 1985 (p. 616–619); and (b) "A 90ns 100K Erase/Program Cycle Megabit Flash Memory", V. Kynett et al., ISSCC 1989 (p. 140–141). References (a) is also discussed in U.S. Pat. No. 4,698,787.

Referring to FIG. 1a, in prior-art memory cells, such as those discussed in references (a) and (b), the field oxide isolation regions 25 are used to improved capacitive coupling between control gate 14 (poly 2) and floating gate 13 (poly 1), by increasing the capacitance area between control gate and floating gate in addition to providing isolation between adjacent cells. The source line 17 (diffused N+) runs substantially parallel to the wordlines 15 and separates the field oxide regions 25 between pairs of wordlines 15. Drain regions 12 are shared between each pair of wordlines 15. The drains 12 in a column are connected by a metal column line (not shown). Each drain contact with the metal line is isolated from the adjacent contact by the field oxide regions 25.

Thus, the field oxide regions 25 provide both improved control-gate/floating-gate capacitive coupling as well as isolation between adjacent cells. The presence of field oxide regions 25 separated by a continuous source line 17 avoids the need for a metal line contacting sources 11, saving valuable silicon real estate. These field oxide regions 25 are designed and formed using masks having straight lines. However, after a LOCOS process, the field oxide regions 25 look like "dog bones" (as shown by FIGS. 1a–1b) for at least two reasons. The first reason is related to lithographic rounding at the corners and the second reason is related to the field oxide growth rate differences between narrow regions and wide regions.

The dog-bone-shaped field oxide regions 25 result in undesirable effects. Because of manufacturing misalignments, such as that illustrated by the different sizes of regions A and B in FIG. 1b, adjacent cells sharing the same source line 17 may have different coupling coefficients between control-gates 14 and source regions 11, resulting in bimodal distributions of array programming, reading and erasing characteristics. In addition, the cell width is also nonuniform because of the "dog bone" effect.

Accordingly, a need exists for a cell array structure that avoids these weaknesses.

SUMMARY OF THE INVENTION

The structure and method of this invention avoid the field oxide "dog bone" effect. The field oxide regions are well defined with rectangular contours, so that manufacturing misalignments have minimal effect on control-gate to floating-gate capacitance. Independent of curing the "dog bone" effect, this invention also allows formation of self-aligned drain region contacts and relaxes the constraints on cell scalability.

According to this invention, rectangular field oxide strips are realized by cutting the source line through a series of long, parallel field oxide strips running essentially perpendicular to the wordlines.

A floating-gate conductor is disposed over and insulated from the channel region for controlling the channel conductivity. A control-gate conductor is disposed over and insulated from the floating gate. The floating-gate and control-gate conductors each include a channel section of a predetermined length, which is used during fabrication to align the source/drain junctions. The channel sections permit the source/drain implants to be self-aligned, provide effective control of channel length, and facilitate junction profiling (such as by doping optimization and/or subsequent controlled heat treatment cycles) to create abrupt drain-channel junctions, thereby increasing the efficiency of hot-carrier injection for programming. In addition, junction profiling allows graded source junction for erasing.

The floating gates of the memory cells of the array are formed from a first-level conductive polysilicon layer, the first-level layer being formed over a channel-oxide layer, then patterned and etched to define parallel floating-gate strips. A second-level conductive polysilicon layer is formed over the substrate, insulated from the parallel floating-gate strips by an inter-level insulator layer.

A stack-etch procedure is used to define wordlines and floating gates for each row of memory cells. Each wordline includes control-gate conductors, which are capacitively coupled (through the inter-level insulator) to the floating gates of each memory cell in that wordline row. Each floating-gate conductor extends across most of a memory cell, maximizing capacitive coupling to the overlying control-gate conductor. Using a source line mask, elongate field oxide strips are cut, making the source-line region continuous. The floating gate and control gate are used as self-aligned implant mask for implanting in a first conductivity-type substrate a source region of and a drain region of a second conductivity-type on either side. Junction profile implants may be used to create an abrupt drain-channel junction (made optimum for programming operations) and a sloped (graded) source-channel junction (made optimum for erasing operations).

During cell programming, appropriate programming voltages applied to the selected control-gate wordline and drain bitline to create a high-current condition in the selected channel region, injecting channel-hot electrons and/or avalanche-breakdown electrons across the channel oxide to the floating gate. During cell erasing, appropriate erasing voltages applied to the control-gates/wordlines and the source lines allow removal of a selected charge from the floating gate.

The process of the present invention includes forming elongate cell-isolation field-oxide regions in a semiconductor layer. A gate oxide is formed over the region including but not limited to what will be channel regions. A first polysilicon layer is then formed over the integrated circuit and floating-gate strips are defined and formed from that first polysilicon layer. An inter-level dielectric is formed over the first polysilicon layer. Thereafter, the second polysilicon layer is formed over inter-level dielectric layer and a stacked etch is performed on the first and second polysilicon layers and the inter-level dielectric layer. The stack etch defines the floating gates and the wordlines, including control gates. Using the source line mask, elongate field oxide strips are cut exposing the silicon substrate. As part of the source line mask, field oxide around the bit contact may also be etched off. Self-aligned source and drain junctions are formed next. The structure is covered with an insulating material. Holes are formed through the insulating material for subsequent connection of drain-column lines to the drain regions, the source lines and the control gates (wordlines).

Because the channel widths of cells sharing the same source line are uniform, even when the stack etch is misaligned to a certain extent, the coupling of the control gate to the source region is uniform between those cells sharing the same source line. This results in a tighter erase distribution as well as more uniform programming and reading.

BRIEF DESCRIPTION OF THE DRAWINGS

In the drawings:

FIGS. 3a–3d illustrate final fabrication steps not included in FIGS. 4a–4e; and FIGS. 4a–4e are enlarged plan views of a small part of a memory cell array of this invention at successive fabrication stages.

DETAILED DESCRIPTION OF THE INVENTION

Figure 1B:
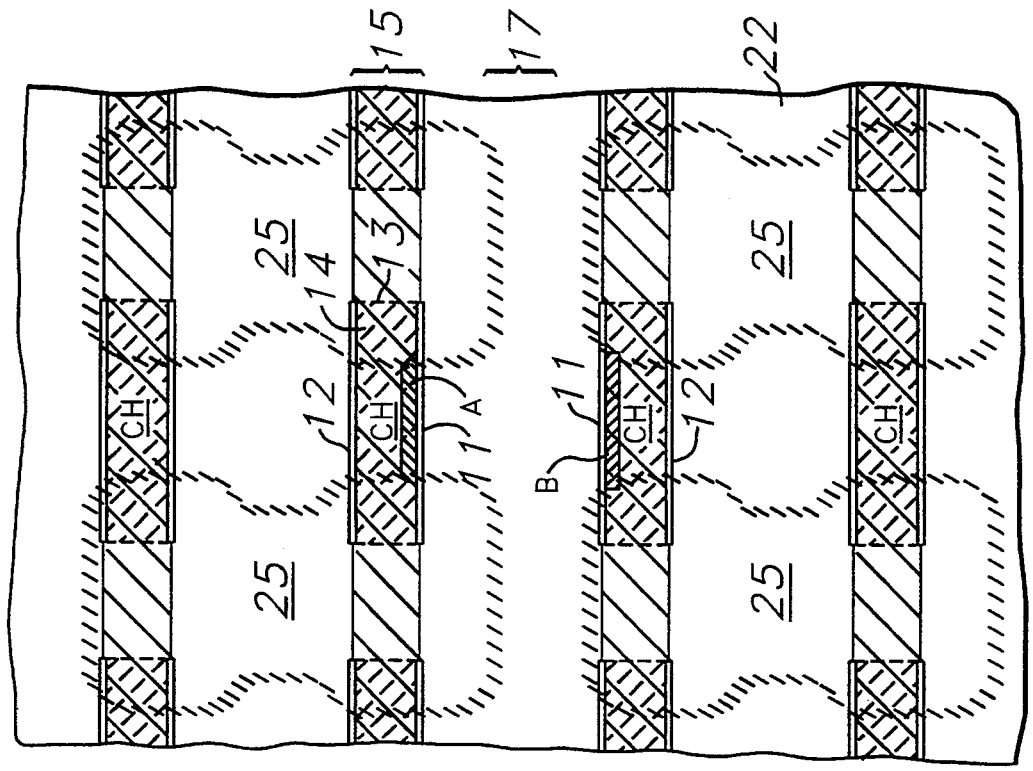
FIGS. 1a–1b are plan views of a prior-art cell array of the type discussed herein, FIG. 1a illustrating proper alignment of a stack-etch and FIG. 1b illustrating the effect of misalignment.
Figure 1A:
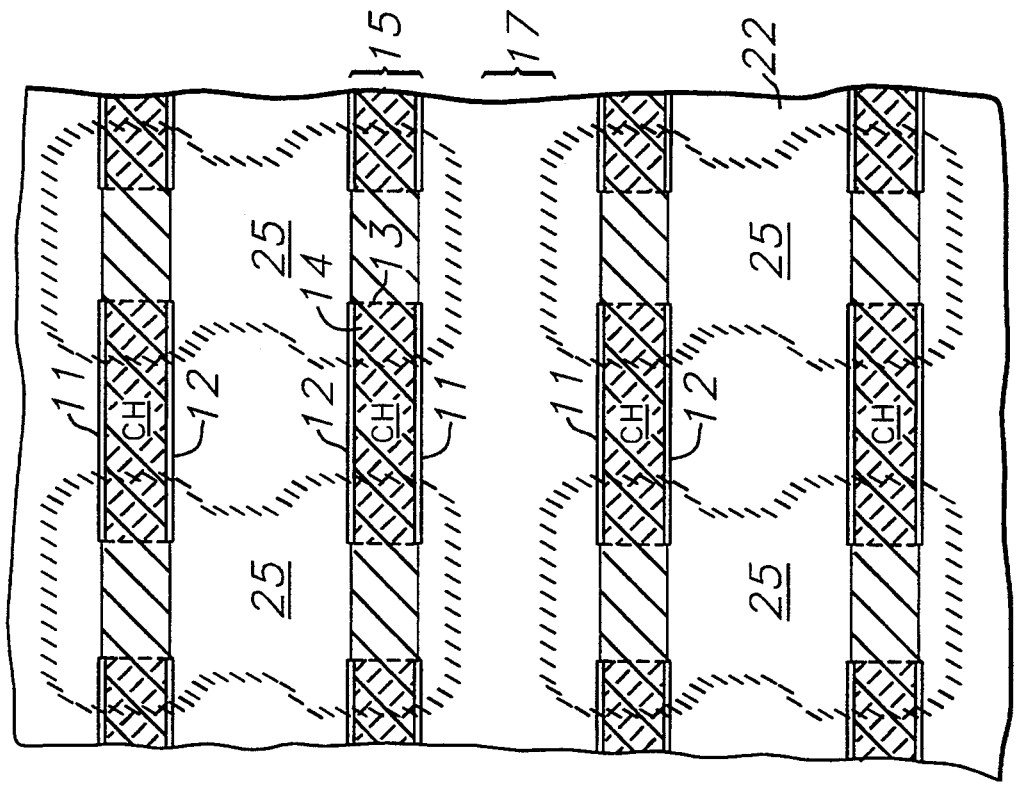
Figure 2:
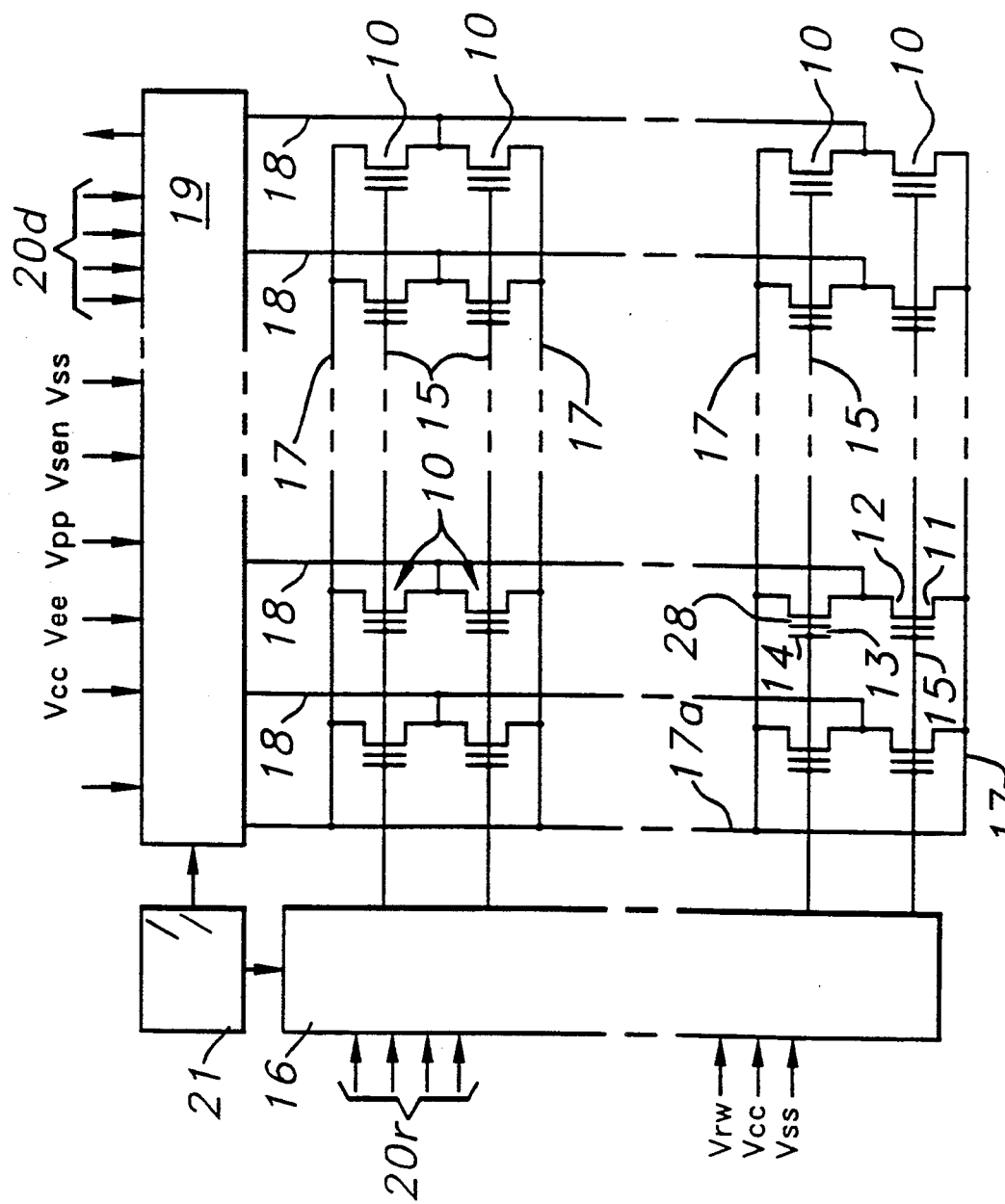
FIG. 2 is an electrical schematic diagram, in partial block form, of a memory cell array.

Referring to FIG. 2, an example array of memory cells, which is an integral part of a memory chip, is shown for the purpose of illustrating use of the circuit of this invention. Each cell is a floating-gate transistor 10 having a source 11, a drain 12, a floating gate 13, a control gate 14 and a gate oxide 28. Each of the control gates 14 in a row of cells 10 is connected to a wordline 15, and each of the wordlines 15 is connected to a wordline decoder 16. Each of the source electrodes 11 in a row of cells 10 is connected to a source line 17. Each of the drain electrodes 12 in a column of cells 10 is connected to a drain-column line 18. Each of the source lines 17 is connected by a column line 17a to a column decoder 19 and each of the drain-column lines 18 is connected to the column decoder 19.

In a write or program mode, the wordline decoder 16 may function, in response to wordline address signals on lines 20r and to signals from Read/Write/Erase control circuit 21, (or microprocessor 21) to place a preselected first programing voltage Vrw (approx. +12V) on a selected wordline 15, including a selected control-gate conductor 14. Column decoder 19 also functions to place a second programming voltage Vpp (approx. +5 to +10V) on a selected drain-column line 18 and, therefore, the drain region 12 of selected cell 10. Source lines 17 are connected to reference potential Vss. All of the deselected drain-column lines 18 are connected to reference potential Vss. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2V to −6V with respect to the channel region. For memory cells 10 fabricated in accordance with the preferred embodiment, the coupling coefficient between a control gate 14/wordline 15 and a floating gate 13 is approximately 0.5. Therefore, a programming voltage Vrw of 12 volts, for example, on a selected wordline 15, including the selected control gate 14, places a voltage of approximately +6V on the selected floating gate 13. The voltage difference between the floating gate 13 (at approx. +5 to +6.5V) and the grounded (approximately 0v) source line 17 is insufficient to cause a Fowler-Nordheim tunneling current across the gate oxide 28 between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In a flash erase mode, the column decoder 19 may function to leave all drain-column lines 18 floating. The wordline decoder 16 functions to connect all the wordlines 15 to reference potential Vss. The column decoder 19 also functions to apply a high positive voltage Vee (approx. +10V to +15V) to all the source lines 17. These erasing voltages create sufficient field strength across the gate oxide region 28 to generate a Fowler-Nordheim tunnel current that transfers charge from the floating gate 13, erasing the memory cell 10. Since the potential on the wordline 15 is 0V, the cell 10 remains in the nonconducting state during erase, and therefore, no channel-hot carriers are generated. The field-plate breakdown voltage of the source line junction has been made high enough to inhibit hot-carrier injection. In addition, the source junction should be optimized to minimize band-to-band tunnelling during erase operation.

In the read mode, the wordline decoder 16 functions, in response to wordline address signals on lines 20r and to signals from Read/Write/Erase control circuit 21, to apply a preselected positive voltage Vcc (approx. +5V) to the selected wordline 15, and to apply a low voltage (ground or Vss) to deselected wordlines 15. The column decoder 19 functions to apply a preselected positive voltage Vsen (approx. +1V) to at least the selected drain-column line 18 and to apply a low voltage (0V) to the source line 17. The column decoder 19 also functions, in response to signal on address lines 20d, to connect the selected drain-column line 18 of the selected cell 10 to the DATA OUT terminal. The conductive or nonconductive state of the cell 10 connected to the selected drain-column line 18 and the selected wordline 15 is detected by a sense amplifier (not shown) connected to the DATA OUT terminal. The read voltages applied to the memory array are sufficient to determine channel impedance for a selected cell 10 but are insufficient to create either hot-carrier injection or Fowler-Nordheim tunneling that would disturb the charge condition of any floating gate 13.

For convenience, a table of read, write and erase voltages is given in TABLE I below:

TABLE I

| | Read | Write | Flash Erase |
| --- | --- | --- | --- |
| Selected Wordline | 5V | 12V | 0V (All) |
| Deselected Wordlines | 0V | 0V | — |
| Selected Drain Line | 1.0V | 5–10V | Float (All) |
| Deselected Drain Lines | Float | 0V | — |
| Source Lines | 0V | About 0V | 10–15V (All) |

Figure 3A:
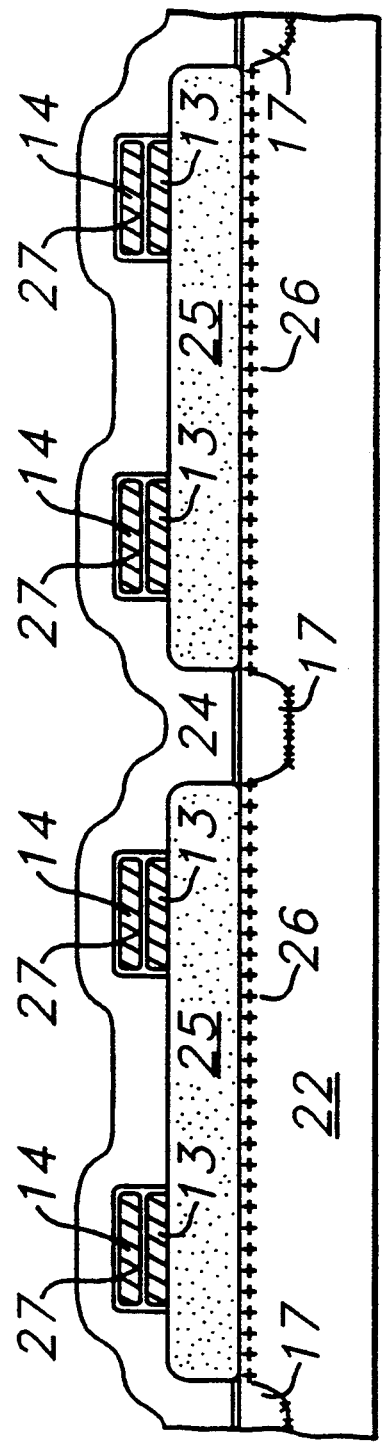
FIGS. 3a–3d are elevation views of a small part of a memory cell array of this invention, taken along lines I—I, II,II, III—III and IV—IV of FIG. 4e.
Figure 3B:
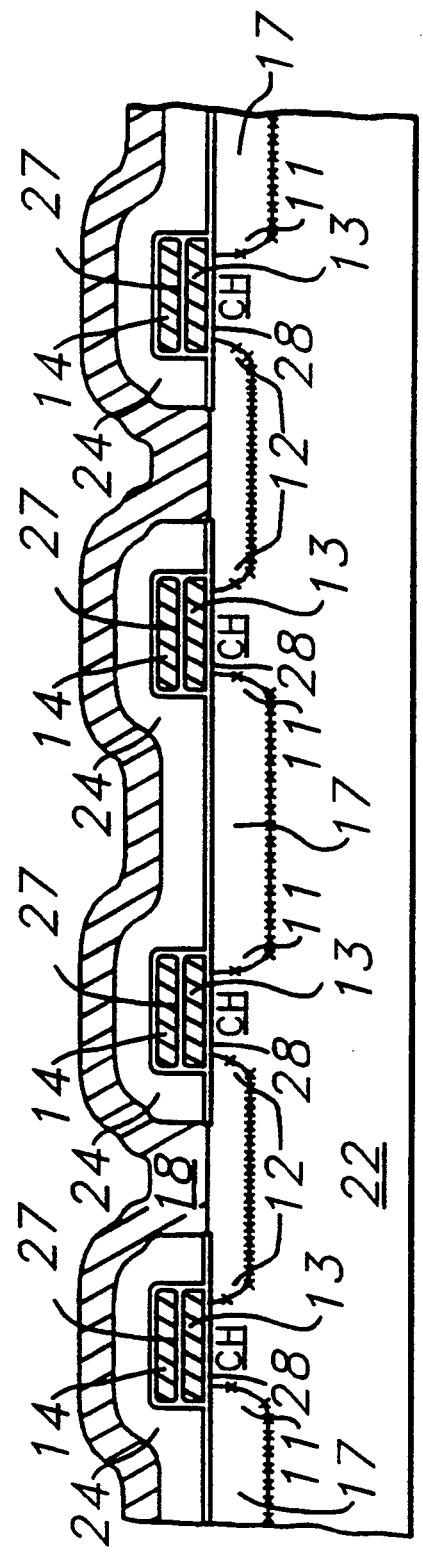
Figure 3C:
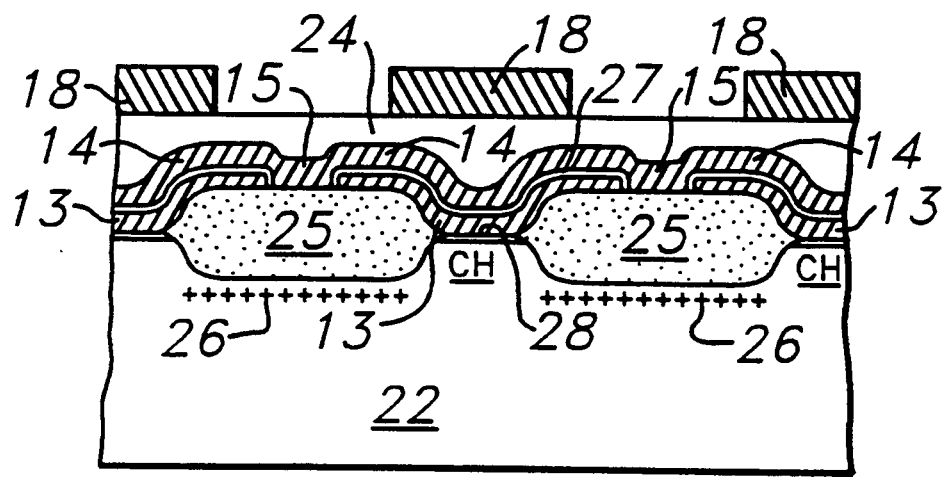
Figure 3D:
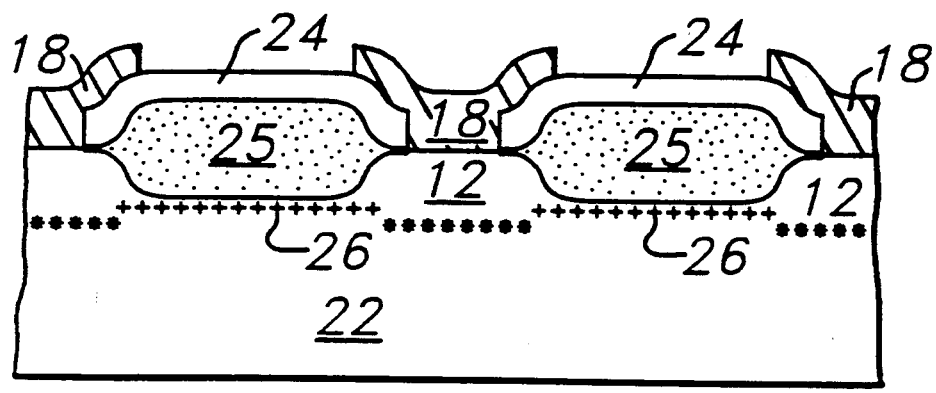

Referring now to FIGS. 3a–3d and 4e, an array of electrically-erasable and programmable memory cells is formed in a face of a P-type silicon substrate 22. Multiple conductive wordlines 15, each defining a row of memory cells, are formed on the face of the substrate 22. The N+ source lines 17 are connected to source regions 11 of memory cells. The source lines 17 are contacted by a metal conductor (not shown) every 8, 16 or 32 cells to save chip area required by contacts. The drain-column lines 18, illustrated in FIGS. 3b–3d, are columnar conductors separated from wordlines 15 by insulator regions 24 and are connected to drain regions 12 of columnar pairs of cells. Cell-isolation thick-field insulator columns 25 and channel isolation stop regions 26 provide isolation between adjacent source lines 17, as well as between adjacent columns of cells.

A wordline 15 includes control-gate conductors 14 for the memory cells in the wordline 15 row. Floating-gate conductors 13 extend across a memory cell 10 (aligned with a respective wordline 15/control gate 14), over the channel Ch between source 11 and drain 12. The wordlines 15 are actually aligned with the floating-gate conductors 13. The slight offset depicted in FIG. 4e is for the purpose of clarity.

Figure 4D:
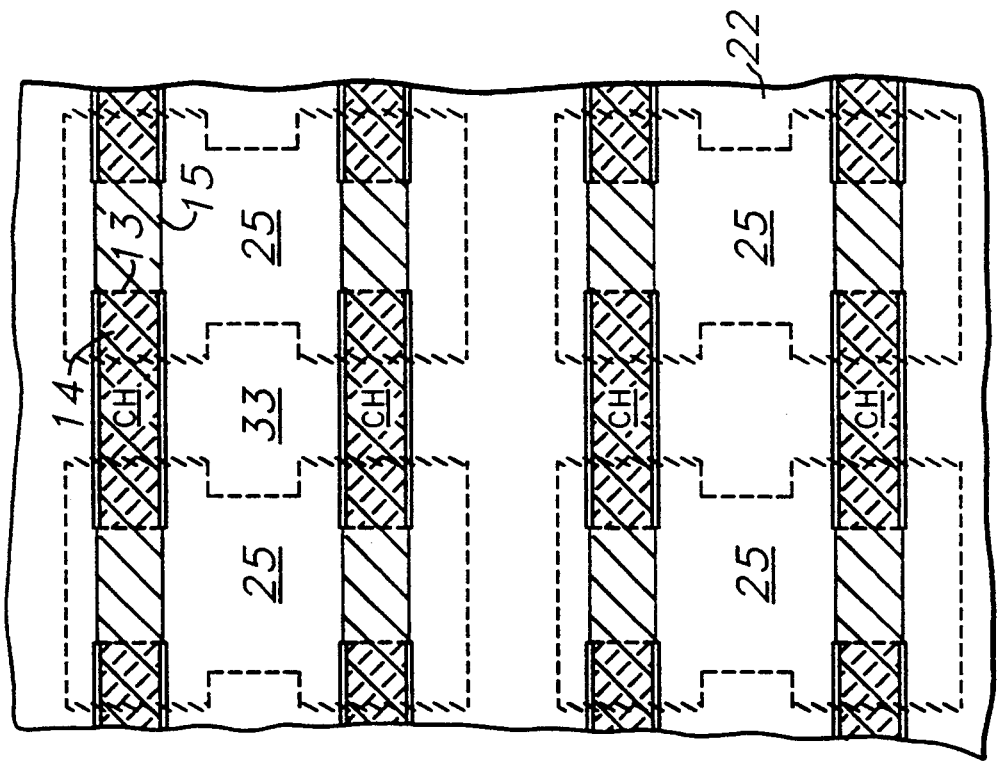
Figure 4C:
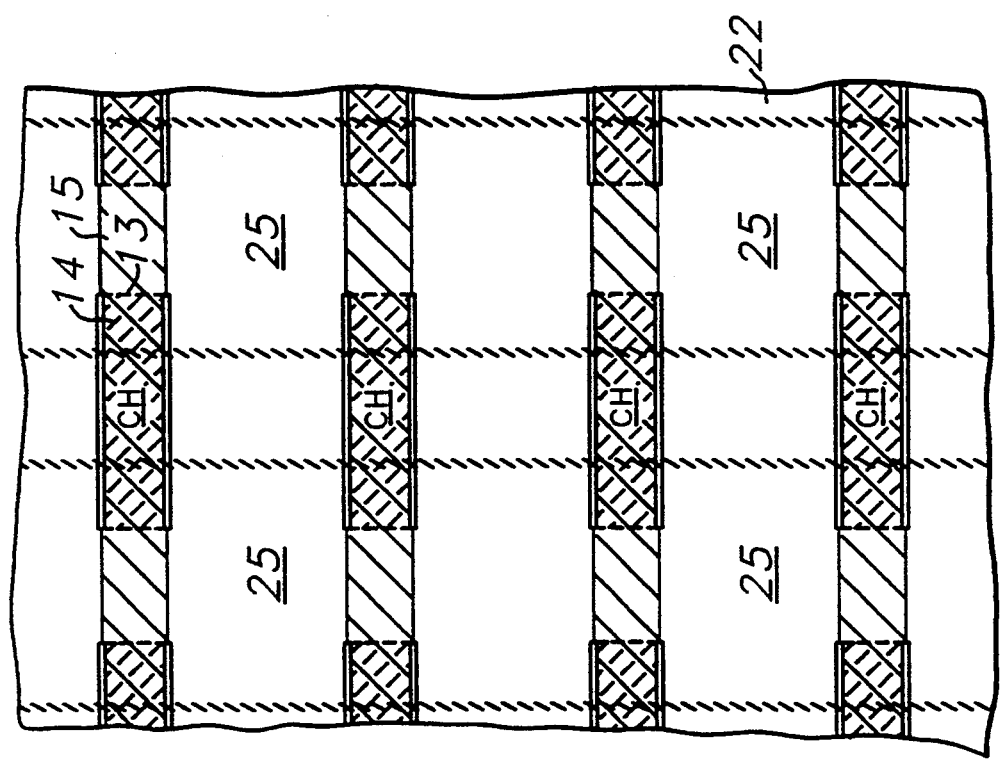
Figure 4E:
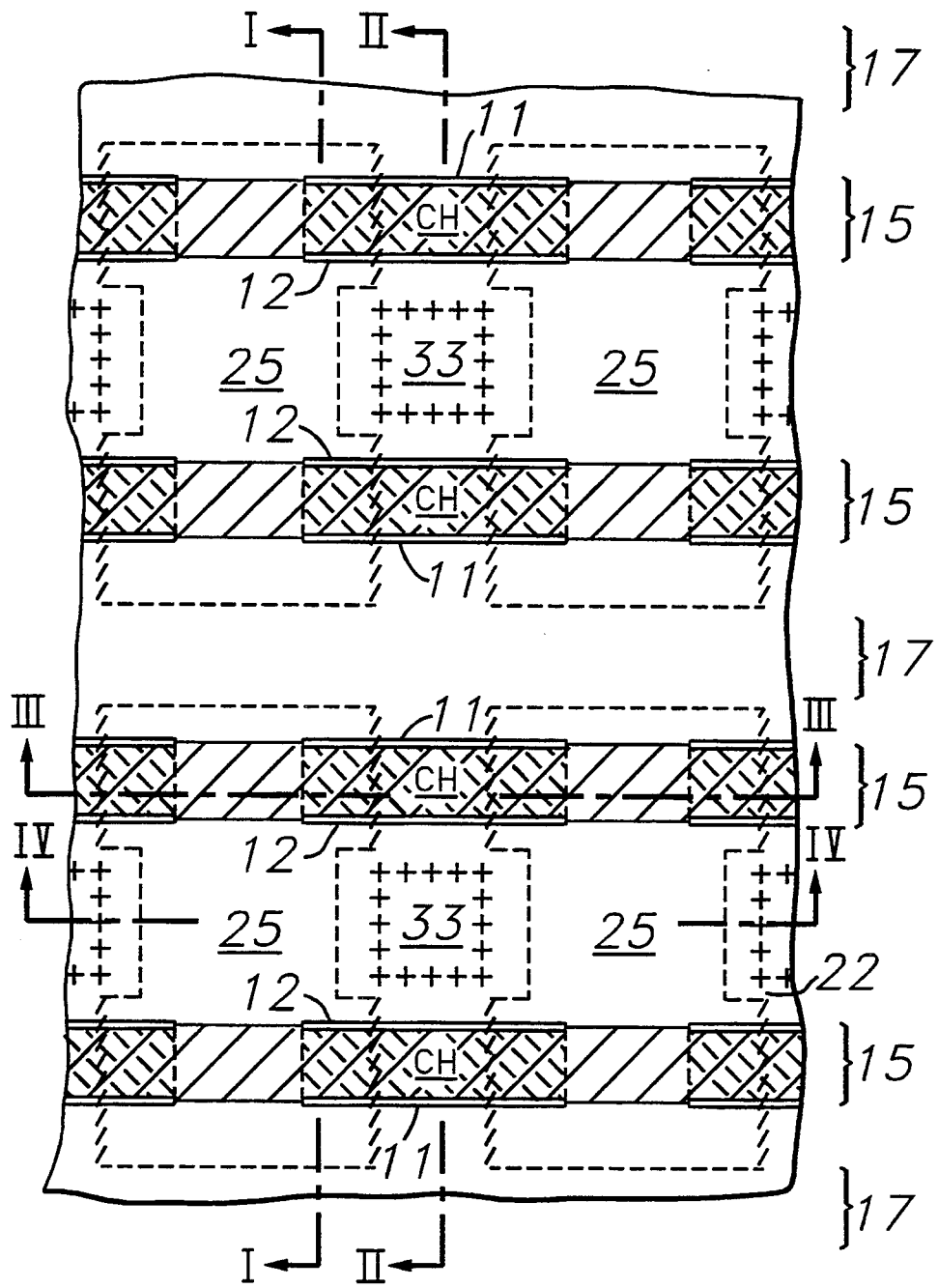

As shown in FIGS. 3b and 4e, the N+ source line 17 is extended to include source regions 11 of cells in alternate adjacent rows. Shared drain regions 12 between alternate adjacent rows are connected to drain-column lines 18, as illustrated in FIG. 3b.

For each memory cell, wordline 15 includes a control gate conductor 14. An underlying floating-gate conductor 13 is insulated from the control gate conductor 14 by an inter-level dielectric insulator (e.g., Oxide-Nitride-Oxide) layer 27, and from the channel region Ch by the gate insulator (e.g., oxide) layer 28.

The floating-gate 13 is capacitively coupled to the channel region Ch through relatively thin gate insulator 28 (about 80–150 Angstroms of oxide). The capacitive coupling between the control gate 14 and the floating gate 13 is enhanced by extension of the control gate 14 and the floating gate 13 over parts of adjacent cell-isolation thick-field insulators 25.

Various implant procedures can be used to tailor the junctions of the source/drain regions 11,12 for optimum erasing and programming efficiency, respectively. For programming efficiency, the drain-channel junction is tailored to exhibit an abrupt profile that facilitates hot-carrier injection. For erasing operations free of gated-diode breakdown, the source-channel junction is tailored to exhibit a sloped (graded) profile.

The memory cell pair configuration of the illustrated embodiment is not critical to the present invention, but is a matter of routine design choice. Alternative memory cell configurations may be adapted to use various aspects of this invention, including Fowler-Nordheim tunneling for erasing and channel and junction profiling to enhance avalanche-injection efficiency.

A method of fabricating the preferred embodiment of the injection-program/tunnel-erase EEPROM cell 10 pair is described with reference to FIGS. 4a–4e, which are plan views of a part of the device illustrated in FIGS. 3a–3d. (FIGS. 4a–4e do not show the drain column lines 18 and insulators 24 of FIGS. 3b–3d.) Conventional photo-lithographic techniques well known in the art are used. These figures, and the various layers and areas, are not drawn to any absolute or relative scale, but are for illustrative purposes only.

The starting material is a slice of P-type silicon of which the substrate 22 is only a small portion. The slice is perhaps 6 inches in diameter, while an individual member cell 10 is only a few microns wide and a few microns long. A number of process steps would normally be performed to create transistors peripheral to the memory array, and these will not be discussed. For example, the EEPROM memory device may be of the complementary field effect type (CMOS) having N-wells and P-wells formed in the substrate 22 as part of a prior process to create peripheral transistors.

A pad-oxide layer about 400 Angstroms thick is grown or deposited on the face of substrate 22. The pad-oxide layer protects the substrate 22 during the initial fabrication steps and will be subsequently removed. A silicon-nitride layer is then deposited over the pad-oxide layer using low pressure chemical vapor deposition. The pad-oxide and silicon-nitride layers are then patterned and plasma-etched to expose elongate areas where columns of cell-isolation thick field-insulators 25 are to be formed.

A boron implant at a dose of about $8 \times 10^{12}$ cm$^2$ is performed to create a P+ channel stop region 26 that will isolate the memory cells. After removing the photoresist, the thick field oxide that forms the cell-isolation thick-field insulators 25, as illustrated in FIGS. 4a and 3a–3d, is thermally grown in a localized oxidation process to a thickness of about 6000–10000 Angstroms by exposure to steam at about 900° C. and one atmosphere for several hours. Alternatively, a high pressure oxidation (HIPOX) can be used to decrease oxidation time. As is well-known, the oxide grows beneath the edges of the silicon-nitride layer, creating "bird's beak" areas instead of abrupt transitions. Continuous, long strips of field oxide perpendicular to future wordlines (poly 2) result.

Next, the remaining portions of the pad-oxide and silicon-nitride layers are removed. This procedure exposes the silicon substrate 22 between the cell-isolation thick-field insulators 25. Next, high-quality gate oxide (80–150A) is grown, followed by threshold-adjust implant.

Alternatively, a dummy oxide may be grown, a threshold-adjust implant made, the dummy oxide removed, a pre-gate clean-up made, followed by gate-oxide formation. Threshold-adjust implant may consist of one or more implants for channel profiling.

The process of forming the floating-gate conductors is performed by depositing a layer of first-level polysilicon over the substrate 22 face. This first-level polysilicon layer is deposited to a thickness of about 1500–2500 Angstroms. The layer is doped N-type with phosphorous and may be de-glazed, if needed.

The first-level polysilicon layer is patterned with photoresist to define insulated floating-gate strips 31, as illustrated in FIG. 4b, to define two edges of the floating gates 13. (A later stack-etch procedure is used to complete the definition of the floating-gate conductors 13.) The photoresist covering the tops of the floating-gate strips 31 is then removed.

After the floating-gate strip 31 fabrication, optionally about 2000–4000 Angstroms of oxide is deposited, and anisotropically etched back to create sidewall oxides at the edges of the floating-gate strips 31. Next, an inter-level insulator layer 27 such as oxide/nitride/oxide (ONO) of equivalent oxide (dielectric) thickness in the range of 200–400 Angstroms is formed over the substrate 22 memory array by conventional techniques.

A second-level polysilicon layer 2000–4500 Angstroms thick is then deposited over the face of the substrate 22, highly doped N+ to make it conductive, then de-glazed. Next, a stack-etch procedure is used to create the wordlines 15 that correspond to rows of memory cells 10. Photoresist (not shown) is applied to define wordline 15 stacks that include the second-level polysilicon layer, the inter-level insulator layer 27, and the first-level polysilicon layer that forms columnar floating-gate strips 31. As illustrated in FIG. 4c, the stack etch defines a plurality of elongated wordlines 15 running substantially parallel to the source lines 17, to be formed later, defining the floating gates 13, and in particular the channels Ch between what will be the sources 11 and drains 12.

Thus, the stack etch produces wordline conductors 15 that are continuous in the wordline 15 direction and produces a control gate 14 for each memory cell 10 in each wordline 15 row. The control gate 14 is capacitively coupled to respective underlying floating gates 13 through the corresponding portion of the inter-level insulator 27.

The channels Ch formed by the stack etch are configured with a predetermined length, and the stack-etched first- and second-level polysilicon layers are used in later fabrication steps as an implant mask to establish the length of the channel regions between sources 11 and drains 12. In this manner, the source and drain junctions can be tailored for optimum erase and program efficiency, respectively.

With reference to FIGS. 4d and 4e, after the stack-etch process and a clean-up process, a source-line-mask process is used to define source line 17, exposed field oxide is etched off, and N-type implants are performed, the implants self-aligned to the field oxide edges. The N-type source implants may be a combination of arsenic (0 to 5E15 cm$^{-2}$ 60–130 KeV) and phosphorus (0 to 2E14 cm$^{-2}$ 60–150 KeV) The photoresist covers the drain junction edge and the source junction edge, including the poly 2/poly 1 stack region.

During the source-line process discussed here, the drain contact region 33 may also be exposed to field oxide etch and source-line implant. Because of the bird's beak effect during the LOCOS procedure, a lower limit on LOCOS width places constraints on the LOCOS scaling, and hence the cell-scaling. The use of the source-line process to etch field oxide strips 31 and to implant the contact regions 33 relaxes the constraints on cell scaling, allowing a more dense array of cells 10.

After resist removal, and appropriate clean-up, a photoresist layer is again applied, and defined by a source mask. This photoresist step protects the drain area and exposes the source line, and the source junction, to an N-type implant which may be a combination of phosphorus (dose of 1E14 to 5E15 cm$^{-2}$ at 60–135 KeV) and arsenic (dose of 1E15 to 5E15 cm$^{-2}$ at 60–135 KeV). The implant is self-aligned to the stack edge. The phosphorus implant allows grading of the source junction to improve source junction field-plate breakdown voltage.

After resist removal, and appropriate clean-up, the source implants may be annealed at 850°–1000° C. for 10–30 minutes.

The next step is to implant, using a photoresist process on the drain side of each channel-section Ch, the shared N+ drains 12 and contact region 33. The stack etched first- and second-level polysilicon strips form an implant mask covering the channel regions Ch between sources 11 and drains 12. An arsenic implant is performed at a dosage of about $5 \times 10^{15}$ cm$^{-2}$ at about 60–130 KeV to create the self-aligned N+ drain regions 12 for each memory-cell 10.

At each channel region Ch, the junctions of the N+ drain regions 12 and the N+ source regions 11 are self-aligned with the corresponding edges of the overlying channel sections of floating gates 13 and control gates 14 formed by the stack-etch step. The drain 12 junction profiles can be maintained throughout the remainder of the fabrication process by carefully controlling subsequent heat treatment cycles to minimize further drive.

Following the implant of the drain regions 12, the substrate 22 may be annealed at about 900°–1000° C. in an annealing ambient to repair the implant damage and to provide junction drive.

The N+ implant-drive associated with forming the N+ regions in the implant step results in some diffusion of the arsenic dopant under the corresponding edges of the masking channel sections of the control gates 14 and floating gates 13. By controlling the N+ implant-drive, the diffusion of the arsenic dopant into the channel regions Ch can be minimized, and these drain junctions maintained in fairly abrupt alignment with the corresponding edges of the masking channel-sections of the gates 13 and 14.

An oxide layer 32 is grown over substrate 22, including over wordlines 15, drain regions 12 and source regions 11. Oxide layer 32 enhances data retention. With reference to FIGS. 3a–3d, a borophosphosilicate (BPSG) glass layer 24 is then deposited and reflowed. The BPSG layer 24 is etched to form holes 33 (FIG. 4e)

which extend through the BPSG layer 24 to drain regions 12, and the source lines 17 (contact to source lines 17 not shown). At the same time, holes may be formed for off-array contacts. A metal layer is formed over the substrate and etched to form metal drain-column lines 18 connecting paired drain regions 12 and source lines 17, as well as contacts to wordlines 15. The metal bitlines are formed on the BPSG layer to run over and perpendicular to the wordlines 15 and the buried source lines 17.

The injection-program/tunnel-erase EEPROM cell 10 of this invention provides an EEPROM memory cell 10 that is electrically programmable using hot-carrier injection (channel-hot electrons and avalanche-breakdown electrons), and is electrically erasable using Fowler-Nordheim tunneling. The inherent erase/program characteristic bimodality of prior-art EEPROM cells has been minimized or has been avoided by isolation strips with well-defined edges adjacent the source lines. These LOCOS strips have straight-line extremities (instead of the prior-art rounded extremities) adjacent the source line. Hence the adjacent cells sharing the same source line 17 have relatively equal poly 2 to poly 1 coupling coefficients. In addition, the cell width is uniform across the length of the cell.

The lateral strip etch for source lines 17, and the N-type implantation of the source lines 17 described earlier, may be performed at any time after forming field oxide strip 31, and need not be done in the order described in the preceding process description.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. A method of fabricating a a first memory cell and a second memory cell at the face of a semiconductor substrate of a first conductivity-type, said method comprising:

creating at least a pair of cell-isolation thick-field insulator strips in said substrate;

forming a first conductive layer strip with underlying gate insulator between, parallel to and partially over said insulator strips;

forming an inter-level insulator layer over at least said first conductive layer strip;

forming a second conductive layer over at least said inter-level insulator layer;

stack etching said second conductive layer, said inter-level insulator layer and said first conductive layer strip to define a control gate and a floating gate for each said first and second memory cell, said control gate and floating gate of said first memory cell separated from said control gate and floating gate of said second memory cell by a distance;

at a point subsequent to forming said insulator strips, etching said insulator strips to define a source line between said first and second cells, said source line having a width less than said distance;

selectively implanting a dopant of a second conductivity-type opposite said first conductivity-type in said substrate to form said source line.

2. The method of claim 1, including using said floating gate and control gate as an implant mask to selectively implant a dopant of a said second conductivity-type to create a source adjacent said source line and along one edge of said floating gate and control gate and to create a drain along an opposite edge of said floating gate and control gate.

3. The method of claim 1, including using said floating gate and control gate as an implant mask to selectively implant a dopant of a said second conductivity-type to create a source adjacent said source line and along one edge of said floating gate and control gate and to create a drain along an opposite edge of said floating gate and control gate and including using two dopants to form said source.

4. The method of claim 1, including etching said insulator strips to form a connecting region opposite said control gate from said source line.

5. The method of claim 1, wherein said first conductivity-type is N-type.

6. The method of claim 1, wherein said inter-level insulator layer is formed by a three-insulator oxide-nitride-oxide layer.

* * * * *